US010840163B2

(12) United States Patent
Lin et al.

(10) Patent No.: US 10,840,163 B2
(45) Date of Patent: Nov. 17, 2020

(54) NEGATIVE ELECTROLUMINESCENT COOLING DEVICE

(71) Applicant: Mitsubishi Electric Research Laboratories, Inc., Cambridge, MA (US)

(72) Inventors: Chungwei Lin, Cambridge, MA (US); Bingnan Wang, Belmont, MA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/861,903

(22) Filed: Jan. 4, 2018

(65) Prior Publication Data
US 2019/0206758 A1 Jul. 4, 2019

(51) Int. Cl.
| | |
|---|---|
| H01L 33/64 | (2010.01) |
| H01L 35/32 | (2006.01) |
| H01L 33/00 | (2010.01) |
| H01L 23/367 | (2006.01) |
| H01L 29/06 | (2006.01) |
| H01L 23/36 | (2006.01) |
| H01L 31/024 | (2014.01) |
| H01L 51/52 | (2006.01) |
| H01L 23/34 | (2006.01) |
| H01L 23/38 | (2006.01) |
| H01L 35/00 | (2006.01) |
| H01L 35/28 | (2006.01) |

(52) U.S. Cl.
CPC ........ *H01L 23/367* (2013.01); *H01L 33/0008* (2013.01); *H01L 33/64* (2013.01); *H01L 33/641* (2013.01)

(58) Field of Classification Search
CPC .................................................. H01L 33/0008
See application file for complete search history.

(56) References Cited

U.S. PATENT DOCUMENTS

| 6,097,139 A * | 8/2000 | Tuck ....................... H01J 1/304 313/309 |
| 6,222,113 B1 * | 4/2001 | Ghoshal .................. H01L 35/32 136/201 |
| 2002/0174660 A1 * | 11/2002 | Venkatasubramanian (Continued) |

OTHER PUBLICATIONS

Watjen et al., "Near-field radiative heat transfer between doped-Si parallel plates separated by a spacing down to 200 nm." Applied Physics Letters, 109, 203112 (2016); doi: 10.1063/1.4967384. Nov. 15, 2016).

(Continued)

*Primary Examiner* — Omar F Mojaddedi
(74) *Attorney, Agent, or Firm* — Gennadiy Vinokur; James McAleenan; Hironori Tsukamoto (57) ABSTRACT

A negative electroluminescent cooling device including a first layer of material; a second layer of material arranged at a non-zero distance from the first layer of material with help of a set of supporters, and an energy source to apply a reverse bias voltage to the first layer of material to cool the second layer of material. The material of the first layer is a semiconductor with a bandgap less or equal to a surface resonant energy of the second layer of material.

16 Claims, 8 Drawing Sheets

(56) References Cited

U.S. PATENT DOCUMENTS

2009/0194870 A1* 8/2009 Nathanson
2016/0298882 A1* 10/2016 Chen ................. F25B 21/04

OTHER PUBLICATIONS

Bernardi et al., "Radiative heat transfer exceeding the blackbody limit between macroscale planar surfaces separated by a nanosize vacuum gap." Nature Communications | 7:12900 | DOI: 10.1038/ncomms12900 |www.nature.com/naturecommunications. Sep. 29, 2016.

Chen et al., "Heat-flux control and solid-state cooling by regulating chemical potential of photons in near-field electromagnetic heat transfer." Physical Review B 91, 134301 (2015) 1098-0121/2015/91(13)/134301 (8) 134301-1 ©2015 American Physical Society.

Raphael St-Gelais et al., "Demonstration of strong near-field radiative heat transfer between integrated nanostructures." Published 2014 in Nano letters.

Chen et al., "Near-Field Enhanced Negative Luminescent Refrigeration." Phys. Rev. Applied 6, 024014— Published Aug. 18, 2016.

Guha et al., "Near-field radiative cooling of nanostructures." Nano Lett. 12, 9, 4546-4550. Aug. 14, 2012. Copyright © 2012 American Chemical Society.

\* cited by examiner

NEGATIVE ELECTROLUMINESCENT COOLING DEVICE

TECHNICAL FIELD

This invention relates to a negative electroluminescent (EL) cooling, which uses electricity to enhance the thermal radiation for the cooling.

BACKGROUND

Electroluminescence (EL) is an optical phenomenon and electrical phenomenon in which a material emits light in response to the passage of an electric current or to a strong electric field. This is distinct from blackbody light emission resulting from heat (incandescence), from a chemical reaction (chemiluminescence), sound (sonoluminescence), or other mechanical action (mechanoluminescence). The EL is the result of radiative recombination of electrons and holes in a material, usually a semiconductor. The excited electrons release their energy as photons—light. Prior to recombination, electrons and holes may be separated either by doping the material to form a p-n junction (in semiconductor electroluminescent devices such as light-emitting diodes) or through excitation by impact of high-energy electrons accelerated by a strong electric field (as with the phosphors in electroluminescent displays).

In general, usable work can be extracted from two heat reservoirs maintained at difference temperatures. Photovoltaic (PV) and Thermoradiative (TR) devices are two power generators that use photon radiation spectra at different temperatures to generate electricity. PV devices use the low-temperature (low-T) PV cell to generate charge current, whereas TR devices use the high-temperature (high-T) TR cell for power generation.

The EL techniques can be used to extract useful work in PV and TR devices. However, when reversing the light-to-electricity processes, electricity can be provided to maintain the temperature difference and to cool the material. To that end, the EL can be used to cool the device, see, e.g., Phys. Rev. B 91, 13430 (2015)] experimentally demonstrated the EL cooling effect. However, the setup is far-field based and the cooling power of the cooling device is low.

Accordingly, there is a need to use the EL techniques utilizing the near-field effect.

SUMMARY

The electroluminescent (EL) cooling devices apply a forward (positive) bias voltage to the target object to be cooled, whereas the negative EL cooling devices apply a reverse (negative) bias voltage to the heat sink that increases the thermal removal flux from the target object. The positive and negative EL cooling devices share the same microscopic physics with photovoltaic (PV) and thermoradiative (TR) devices. To that end, some embodiments are based on recognition that boost of the radiative power transfer that improves the performance of PV and TR devices can boost the performance of EL cooling device as well.

Specifically, some embodiments are based on recognition that increasing the transmissivity between the heat sink and the target object in the EL cooling devices increases the radiative flux and therefore enhances the cooling power. Some embodiments are based on realization that the transmissivity can be increased by increasing the absorptions of the photons emitted by the target object to be cooled. Such an absorption can be increased via impedance matching between the semiconductor heat sink and the target object resulting in higher values of the radiative flux.

The concept of impedance matching is seen in many fields. For example, electrical impedance is the measure of the opposition that a circuit presents to a current when a voltage is applied. In electronics, impedance matching is the practice of designing the input impedance of an electrical load and/or the output impedance of its corresponding signal source to maximize the power transfer from the source or minimize signal reflection from the load.

Some embodiments are based on realization that the same principles apply to impedance matching for radiative energy transfer. In this case, the impedance matching is a function of surface resonance energy of the materials, which in turn is a function of dielectric properties of material.

To that end, it is an object of some embodiments to increase a number of photons (whose energy is larger than the bandgap of the semiconductor $E_g$) being absorbed by a semiconductor diode, serving as a heat sink, of negative EL cooling system thereby increasing the heat removal flux from the target object which one wants to cool. The bandgap of a semiconductor corresponds to the minimum photon energy that can excite an electron-hole pair in the semiconductor. Some embodiments are based on understanding that the less the separation, the more photons can be absorbed by the semiconductor heat sink. However, the heat sink needs to be sufficiently separated from the target object, because the heat sink and target object have to be kept at different temperatures. In other words, the distance between the heat sink and target object cannot be decreased indefinitely. In some implementations, the target object and the semiconductor heat sink are separated by a few nano-scale pillars, which can be oxides or semiconductor materials.

Some embodiments are based on realization that the absorptions of the photons in the semiconductor heat sink can be increased via "impedance matching" between semiconductor heat sink and the target object one wants to cool. Some embodiments are based on another realization that the impedance matching can be achieved by matching a bandgap of material receiving photon emissions with the energy corresponding to the resonant frequency of the material emitting the photons.

Some embodiments are based on another realization, that, for a number of applications, it is desired to cool the target object that includes metal and/or a metal surface. However, the surface resonant energy of the metal surface can be higher that the bandgap of a semiconductor of the heat sink. To that end, some embodiments pattern the metallic surface with nano-structure to match, i.e., make closer, the bandgap of the heat sink and the surface resonant energy of the target object. Such a matching can further boost the cooling.

Accordingly, one embodiment discloses a negative electroluminescent cooling device, including a first layer of material; a second layer of material arranged at a non-zero distance from the first layer of material, wherein the material of the first layer is a semiconductor with a bandgap less or equal to a surface resonant energy of the second layer of material; a set of supporters to connect and support the first layer of material and the second layer of material while allowing passage of photons from the second layer of material to the first layer of material; and an energy source to apply a reverse bias voltage to the first layer of material to cool the second layer of material.

Another embodiment discloses a method for manufacturing a negative electroluminescent cooling device, including arranging a first layer of material at a distance from a second layer of material using a set of supporters allowing passage of photons from the second layer of material to the first layer of material, wherein the material of the first layer and the material of the second layer are selected such that the material of the first layer is a semiconductor material with a bandgap less or equal to a surface resonant energy of the second layer of material, wherein the second layer of material includes a metal surface patterned with nan-structures; and applying a reverse bias voltage to the first layer of material to cool the second layer of material.

DETAILED DESCRIPTION

For a semiconductor diode at temperature $T_1$ exchanging energy via radiation of photons with a heat reservoir (either a heat source or a heat sink) at temperature $T_2$, the photon emission and absorption are caused by electron transitions across the bandgap of the semiconductor and are associated with electron-hole (e-h) pair recombination and generation, respectively. When applying a reverse (negative) bias voltage to the semiconductor diode, the heat can be removed from the thermal reservoir. In other words, a semiconductor diode with a negative bias voltage effectively the cools the thermal reservoir, and the whole device is termed as a "negative electroluminescent (EL) cooling device".

Figure 1:
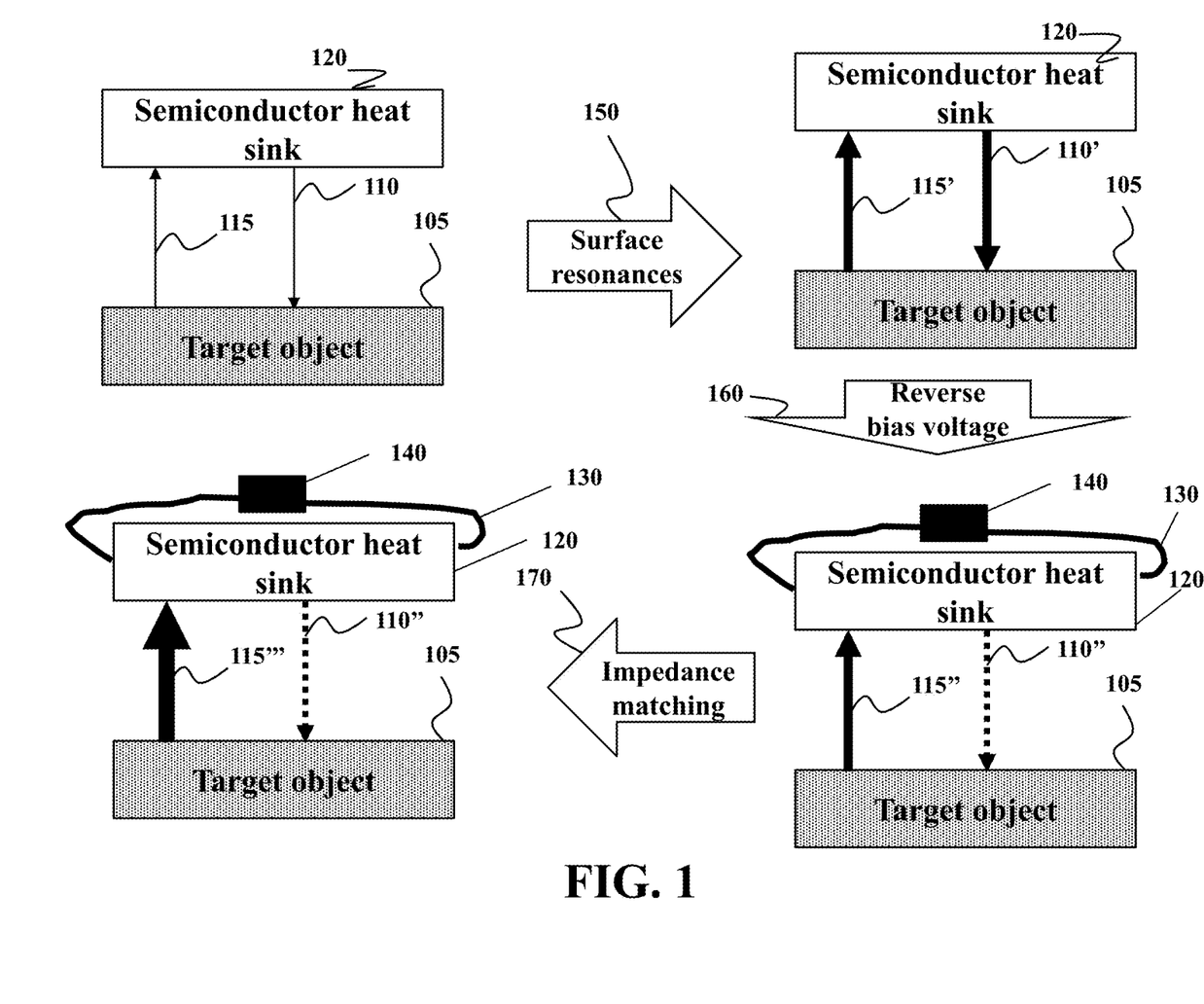
FIG. 1 shows a schematic of principles of a negative EL cooling system used by to some embodiments.

FIG. 1 shows a schematic of principles of a negative EL cooling system used by to some embodiments. The negative EL cooling system includes a semiconductor heat sink 120 and a target object 105 to be cooled. At thermal equilibrium, the thermal radiative flux from heat sink to target object, represented by 115, and the thermal radiative flux from the target object to the heat sink, represented by 110, are identical. The flux difference gives cooling power of the heat sink, and there is no cooling effect at thermal equilibrium.

When the target object supports surface resonances 150, both fluxes, represented by 115' and 110', increase in magnitude but are still identical. In this case, there is still no cooling effect. When a reverse bias voltage 160 is applied to the semiconductor heat sink, e.g., via an energy source 140, the thermal radiative flux 110" from the heat sink to the target object, can be reduced, e.g., to zero, with minimum or without effecting the flux 115" from the target object to the heat sink. In this case, the heat sink only absorbs the thermal radiation from the target object, but does not provide any thermal radiation to the target object. Therefore, the heat is removed from the target object to the heat sink via radiation, providing the cooling effect to the target object. The stronger the thermal radiative flux from the target object to the heat think, the stronger the cooling power of the heat sink.

For given thermodynamic parameters (temperatures $T_1$ and $T_2$, and chemical potential $\Delta\mu$), the performance of a negative EL cooling device depends on the transmissivity between the semiconductor heat sink and the target object which we want to cool. The transmissivity depends on the optical properties of materials and the geometrical parameters. When the two objects are far away, the propagating wavevector components $k<\omega/c$ contribute to the transmissivity, and the upper bound of radiation power is blackbody limit. When the distance between the two objects is smaller than the photon wavelength, evanescent wavevector components also contribute to the integrated transmissivity due to photon tunneling. Furthermore, when surface resonances are supported in the system, strong resonant coupling in the near-field can reshape the radiation spectrum, and enhance the integrated transmissivity by several orders at frequencies close to the resonances.

For a given material, the dispersion of its dielectric function, which determines the surface resonant mode, is an intrinsic property. Insulating materials with dielectric function described by a Lorentz model support surface phonon polaritons; metallic materials with dielectric function described by a Drude model support surface plasmon polaritons. In order to increase the radiative transfer, the energy corresponding to the resonance needs to be close to and slightly larger than the bandgap of the semiconductor.

Increasing the transmissivity between the heat sink 120 and the target object 105 increases the radiative flux 115" and therefore enhances the cooling power. In some embodiments, the resonance supported by the target object is used to enhance the transmissivity. Specifically, some embodiments are based on realization that the transmissivity can be increased by increasing the absorptions of the photons emitted by the target object to be cooled. Such an absorption can be increased via impedance matching 170 between the semiconductor heat sink 120 and the target object 105 resulting in higher values of the radiative flux 115'''.

The concept of impedance matching is seen in many fields. For example, electrical impedance is the measure of the opposition that a circuit presents to a current when a voltage is applied. In electronics, impedance matching is the practice of designing the input impedance of an electrical load and/or the output impedance of its corresponding signal source to maximize the power transfer from the source or minimize signal reflection from the load.

Some embodiments are based on realization that the same principles apply to impedance matching for radiative energy transfer. In this case, the impedance matching is a function of surface resonance of the materials, which in turn is a function of dielectric properties of materials such as angular frequency and damping coefficients or bandwidth of the materials.

Figure 2:
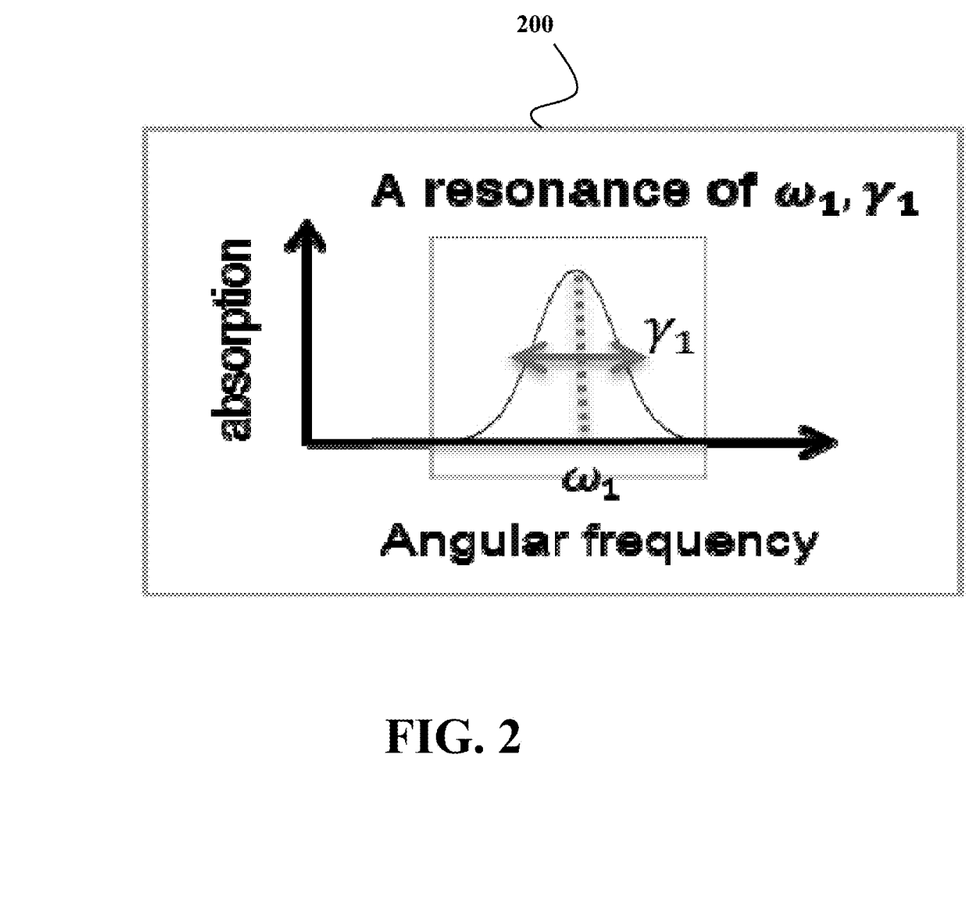
FIG. 2 shows a graph 200 illustrating that the absorption of the photons depends on a surface resonant frequency of the materials of the target object and/or the heat sink.

FIG. 2 shows a graph 200 illustrating that the absorption of the photons depends on a surface resonant frequency of the materials of the target object and/or the heat sink. Some embodiments are based on recognition from Maxwell equations and quantum mechanics that for two materials supporting surface resonance characterized by $\omega_1, \gamma_1$ and $\omega_2, \gamma_2$, respectively, wherein $\omega$ is the resonant energy and $\gamma$ is the corresponding decay rate, the energy transfer between the materials, i.e., the absorption of photons, increases when $\omega_1=\omega_2$ and $\gamma_1=\gamma_2$. If there is only one resonance, the absorption of photons is maximized when $\gamma_1=\gamma_2$. These conditions are termed as "impedance matching conditions".

Some embodiments are based on another understanding the surface resonances of the heat sink and the target object can be matched by comparing a bandgap of the material of the heat sink 120 and the resonant frequency of the target object 105. Specifically, in solid-state physics, a bandgap, also called an energy gap or bandgap, is an energy range in a solid where no electron states can exist. In graphs of the electronic band structure of solids, the bandgap generally refers to the energy difference (in electron volts) between the top of the valence band and the bottom of the conduction band in insulators and semiconductors. It is the energy required to promote a valence electron bound to an atom to become a conduction electron, which is free to move within the crystal lattice and serve as a charge carrier to conduct electric current.

Similarly, the resonant frequency of the target object relates to resonant modes resulting in the high emittance zone of the emittance curve. Because the emittance is strongly peaked at the resonant energies, such a selection results in the enhanced emittance around the resonant energies. To that end, in some embodiments, the energy of surface resonance of the target object is selected to be close to the bandgap of the semiconductor heat sink. For example, in some implementations, the material of the heat sink is a semiconductor material with a bandgap less or equal to energy corresponding to the resonant frequency of the target object.

To achieve such a matching, in some embodiments, the surface of the target object patterned by nano-structure make the surface resonance energy closer to the bandgap of the semiconductor heat sink. When there is no resonance, the dielectric function of the semiconductor heat sink should be identical to the dielectric function of the target object to better match the impedance matching condition. For example, in one implementation of this embodiment, the material of the target object is identical to the material of the semiconductor heat sink to simplify the impedance matching.

Figure 3:
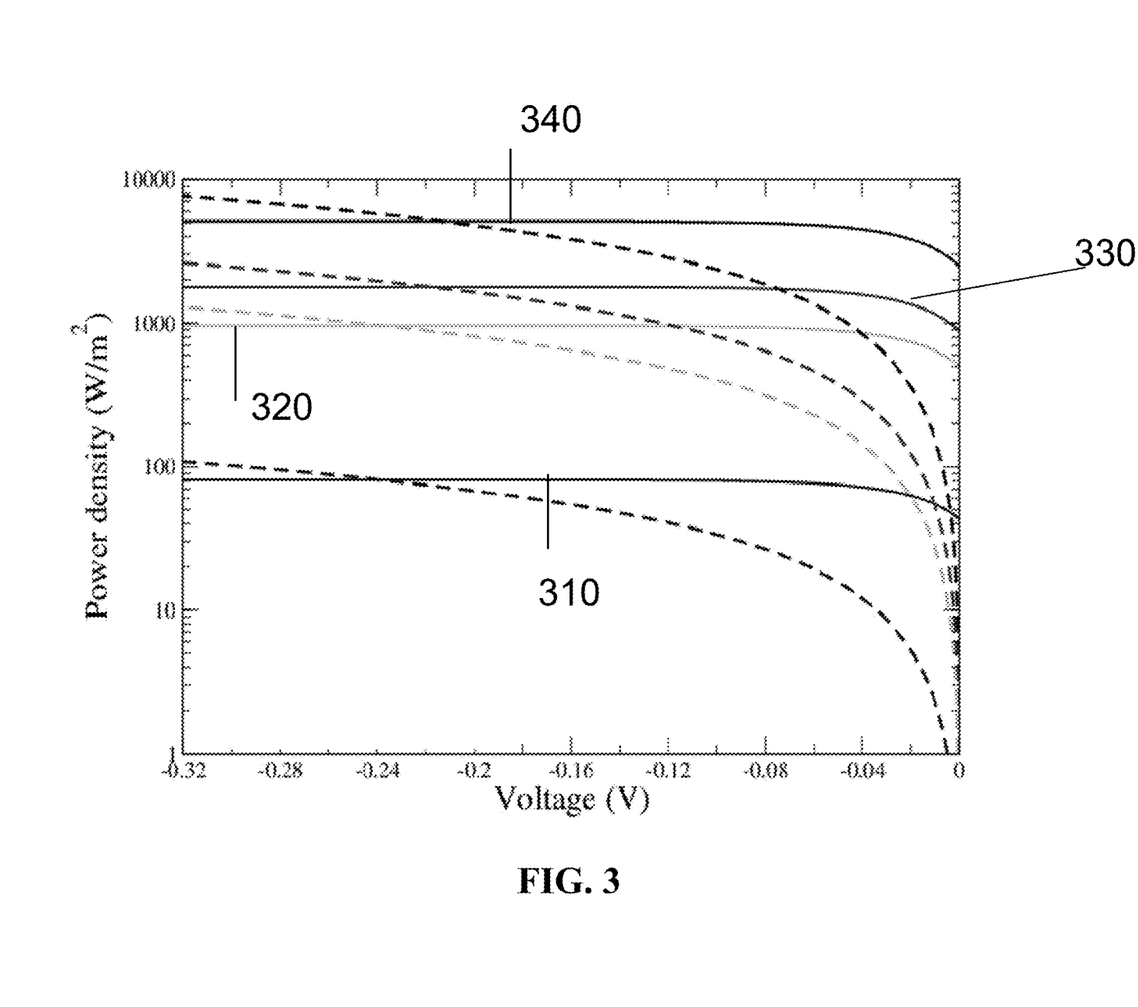
FIG. 3 shows the computed heat removal flux for different choices of to-be-cooled objects of some embodiments.

FIG. 3 shows the computed heat removal flux for different choices of to-be-cooled objects of some embodiments. The solid curves represent the heat removal fluxes whereas the dashed curves represent the work done to devices. The object to cool is fixed at 350 K whereas the semiconductor is fixed at 320 K. The bandgap of the semiconductor is 0.2 eV, simulating the bandgap of Indium Arsenide (InAs). The separation between the semiconductor heat sink and the target object is 20 mn.

The semiconductor is modeled by the dielectric function $\varepsilon_{cell}(\omega)=\varepsilon_r(\omega)+i\varepsilon_i(\omega)$, where $$\epsilon_i(\omega) = \begin{cases} A\sqrt{x-1}/x^2, & x>1 \\ 0, & x<1 \end{cases} \quad (1)$$

$$\epsilon_r(\omega) = \begin{cases} B+A(2-\sqrt{1+x})/x^2, & x>1 \\ B+A(2-\sqrt{1+x}-\sqrt{1-x})/x^2, & x<1 \end{cases}$$

with $$x = \frac{\hbar\omega}{E_g}.$$

$E_g$ is the bandgap of semiconductor heat sink 120. The coefficients $(A,B,E_g)=(6,10,0.2 \text{ eV})$ to approximation InAs semiconductor. Three choices of to-be-cooled objects are given. The first one (320) is the same semiconductor, which is modeled by Eq.(1). The second one is a metal (340) modeled by the dielectric function $$\epsilon_m = 1 - \frac{\omega_p^2}{\omega^2 + i\gamma\omega} \quad (2)$$

The coefficients $(\hbar\omega_p, \hbar\gamma)=(0.28, 0.0005)$ eV are used to approximate a heavily-doped semiconductor or a metal. The third one is modeled by the Lorentz dielectric function (330)

$$\epsilon_L(\omega) = \epsilon_\infty \frac{\omega^2 - \omega_{LO}^2 + i\gamma\omega}{\omega^2 - \omega_{TO}^2 + i\gamma\omega} \quad (3)$$

$\hbar\omega_{LO}=2.2$ eV, $\hbar\gamma=0.0008$ eV, and $\varepsilon\infty=4.46$ to approximate the hexagonal Carbon-Nitride. The blackbody limit (310) is used as the reference. Compared to the blackbody limit, the heat removal flux for the near-field configurations can increase from 10 to 100 times. To that end, some embodiments select the material of the target object to match its resonant frequency to the bandgap of the semiconductors.

Figure 4:
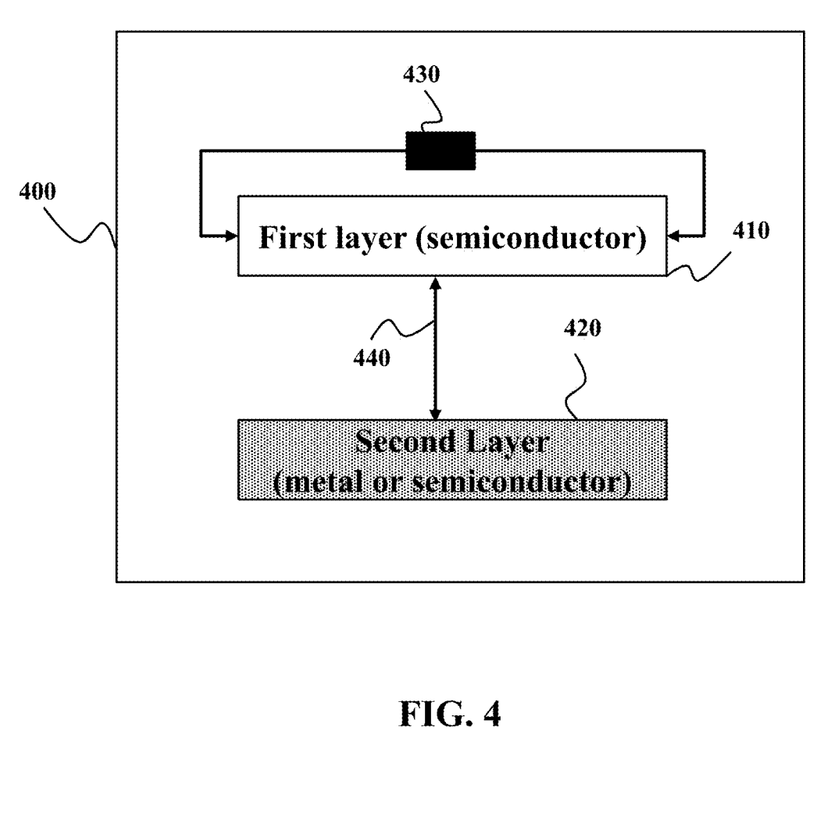
FIG. 4 shows a schematic of a negative electroluminescent cooling device 400 according to some embodiments.

FIG. 4 shows a schematic of a negative electroluminescent cooling device 400 according to some embodiments. The device 400 includes a first layer of material 410, a second layer of material 420 arranged at a non-zero distance 440 from the first layer of material, and an energy source 430 to apply a reverse bias voltage to the first layer of material to cool the second layer of material. In such a manner, the device 400 is a cooling device that can be served in a number of applications. For example, the second layer of material 420 to be cooled can form at least part of one or combination of a processor, a light-emitting-diode, a transistor, and a power amplifier.

In the device 400, the material of the first layer is a semiconductor material with a bandgap less or equal to energy corresponding to the resonant frequency of the second layer of material. In some implementations, the material of the second layer is metal and/or another plasmonic material such as zirconium carbide (ZrC) or doped semiconductors. In some other implementations, the material is of the second layer semiconductor. For example, in one embodiment, the material of the first layer is the same as the material of the second layer.

In various embodiments, the structures and a mutual arrangement of the first layer of material and the second layer of material are selected to establish a surface plasmon resonance between the first layer of material 410 and the second layer of material 420. For example, the distance 400 between the first and the second layers of materials is selected to be smaller than a wavelength of the resonant frequency of the second layer of material. Such a distance 440 is typically small enough to establish the surface plasmon resonance, because in a number of applications, the resonant frequency of the second layer of material is in a range between 10 to 1000 nanometer (nm).

To match the impedance between the first and the second layers of materials, some embodiments select the structures of the first layer of material and the second layer of material, such that the bandgap of the first layer 410 is close to energy corresponding to the resonant frequency of the second layer of material 420. For example, in some implementations, the structures of the first layer of material and the second layer of material are selected such that a ratio of the energy of the bandgap to the energy corresponding to the resonant frequency is between 1 and 1.2.

The principle of material choice and structure design is to make the resonant frequency of the target object close to, but slightly larger than, the frequency corresponding to the bandgap of the semiconductor heat sink. For example, if the second layer is a doped semiconductor, the first layer can be chosen as the same undoped semiconductor as a heat sink. For another example, if the second layer is a metal whose resonant frequency is larger than the frequency corresponding to the bandgap of the first layer, some embodiments introduce some nano-patterns on the surface of the target object to reduce the surface resonant energy.

Also, in some embodiments, the value of the reverse bias voltage applied by the energy source 430 is selected based on a function of the bandgap of the first layer of material 410. For example, in some implementations, the value of the reverse bias voltage is selected such that the amplitude of the voltage, multiplied by the electron charge, is between two and three times of the energy of the bandgap. Notably, product of voltage and electron charge has the dimension of energy, which can be compared with the bandgap. In such a manner, the first layer of material increases its cooling power as a heat sink to cool the second layer of material.

Exemplar Embodiments

Figure 5:
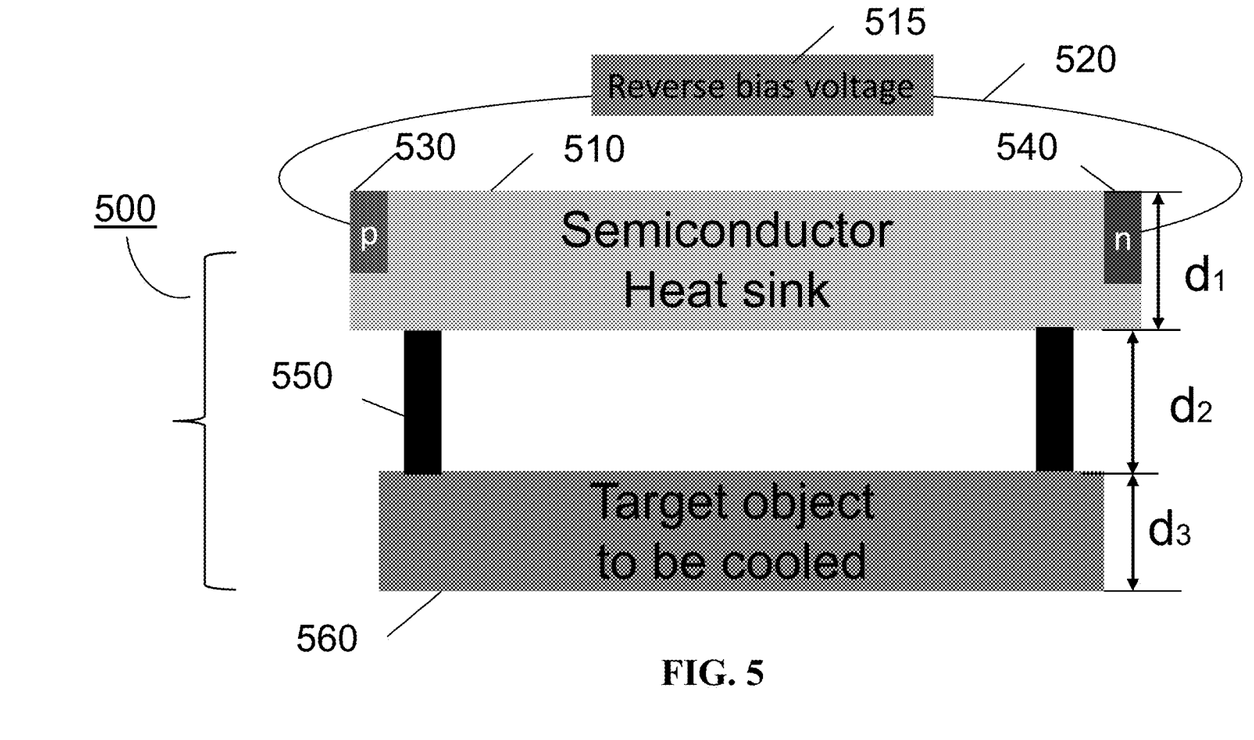
FIG. 5 shows a side view of a negative electroluminescent cooling device 500 implemented using principles of some embodiments.

FIG. 5 shows a side view of a negative EL cooling device 500 implemented using principles of some embodiments. The EL cooling device 500 which includes a first layer of a semiconductor material such as InAs to form a semiconductor heat sink 510 and a second layer of material to form a target object 560 to be cooled. The heat sink 510 is arranged as a non-zero distance $d_2$ from the target object 560 with help of a set of supporters 550. The supporters separate the semiconductor heat sink 510 and the target object 560 at the separation distance $d_2$. In some implementations, the separation distance $d_2$ is between 10 nm and 1000 nm, which is the order of the wave length of the resonant frequency.

In some implementations, the thickness $d_1$ of the semiconductor heat sink 510 is between 1 and 3 μm, which is a few times larger than the wave length corresponding to the surface resonance. There are no constraints on the thickness $d_3$ of the target object 560. The semiconductor heat sink includes a p-doped region 530 (for example, dope Indium Arsenide, InAs, with Beryllium, typically $10^{18}/cm^3$) and an n-doped semiconductor region 540 (for example, dope InAs by Sulfur, Silicon, typically $10^{17}/cm^3$), which are embedded on opposite sides of the semiconductor heat sink. In some implementations, an undoped region extending between the p-doped region and the n-doped region, such that a reverse bias voltage across the p-doped and n-doped regions drives electrons out of the semiconductor heat sink. For example, the semiconductor heat sink 510 can be grown on a substrate by various techniques, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system. The p-doped semiconductor 530 and n-doped 540 are connected by a wire 520 to a voltage source with the reverse bias.

In some implementations, the supporters 550 act as a set of pillars to support the layers of the device 500. The set of pillars/supporters can be made of oxides or semiconductor materials with varying shape and dimensions. For example, in some implementations, each of the supporters 550 is a cylinder, with diameter of 1 μm and a height in the rage of tens to hundreds of nanometers. The supporters 550 can be any materials having a high melting temperature greater than the operation temperature (e.g. T~500K) and low thermal conductance, such as silicon dioxide. The supporters 550 may be formed on the target object 560 by chemical vapor deposition method and lithography steps with etching processes. Here the lithography could be performed using, including but not limited to photo-lithography, electron-beam lithography. Metal deposition can be done using one or combination of an ebeam deposition, a joule evaporation, a chemical vapor deposition and a sputtering process. Further, the top of the supporters 550 and the bottom surface of the semiconductor heat sink 510 can be directly bonded by a typical wafer bonding process in a commercial wafer bonder. In one implementation, the two parts, 510 and 550, are first aligned with an alignment fixture, and placed inside a wafer bonder, subject to a compressive force on the order of hundreds of Newton at a raised temperature, typically around 200C, for an extended period of time, typically a few hours. The density of the supporters 550 is adjusted to maintain the distance $d_2$ after the bounding process. Connection between the wire 520 and the p-doped region 530, and the wire and the n-doped region 540, needs a metal contact. Metal deposition can be done using one or combination of an ebeam deposition, a joule evaporation, a chemical vapor deposition and a sputtering process.

Figure 6:
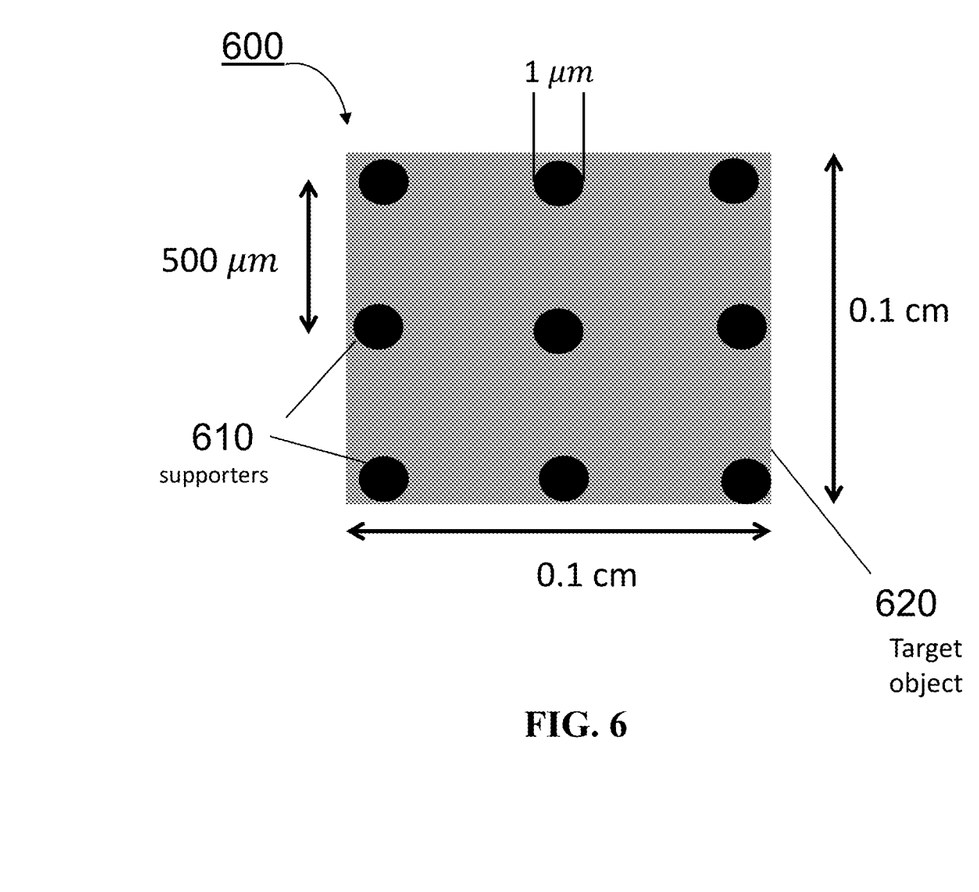
FIG. 6 shows a schematic 600 of arrangement of the set of pillars supporting the layers of materials according to one embodiment.

FIG. 6 shows a schematic 600 of arrangement of the set of pillars supporting the layers of materials according to one embodiment. In this embodiment, the supporters 610 arranged with a typical spacing of hundreds of micrometers on the top of a target object 620, including the edges and corners of the target object 620. The size of the supports 610 is not scaled. In this case, the structured surface is formed on the target object 620. The nearest separations s between the supporters 610 can be selected so as to stably maintain the distance d between the semiconductor heat sink (not shown in FIG. 6) and the target object 620. For instance, the separation may be equal to or less than 500 μm. In the forming process of the supporters 610, a silicon dioxide layer and a negative photoresist layer are deposited on the surface of the target object 620. The ultraviolet exposure is applied with a mask containing two-dimensional arrays of 1 μm diameter holes with separation of hundreds of micrometers or less than hundreds of micrometers. After the development of the negative-photoresist is done, a reactive ion-etching machine is then used to remove the silicon dioxide layer not protected by the photoresist. A semiconductor heat sink (not shown in FIG. 6) is then mated for bonding with the target object 620 that already has the supporters.

Figure 7A:
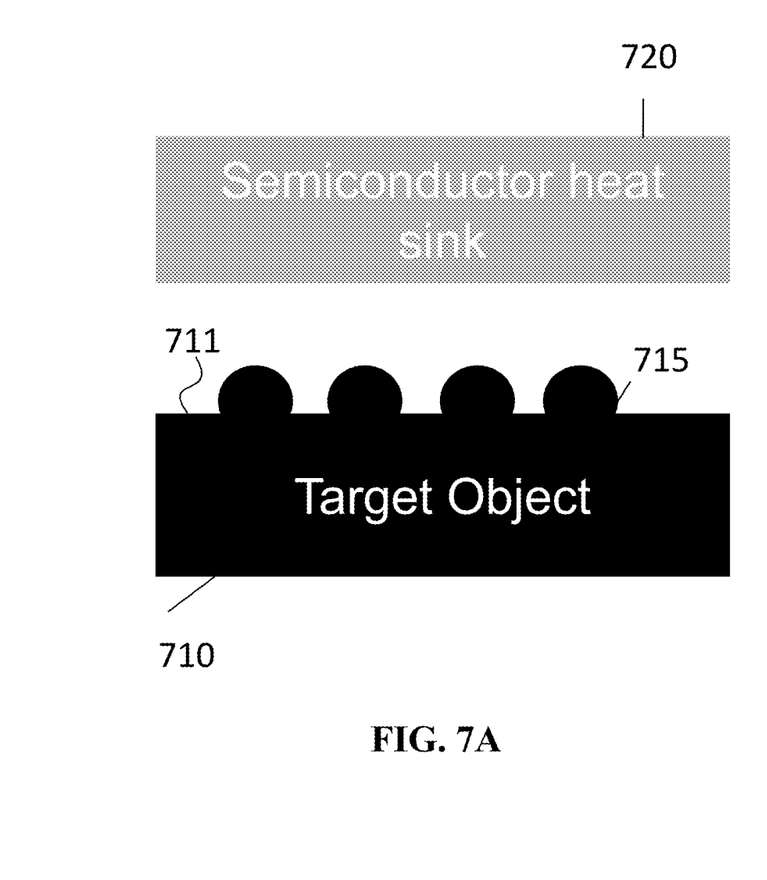
FIGS. 7A and 7B show examples of the target object having surface pattered with periodic nano-scale structures according to some embodiments.
Figure 7B:
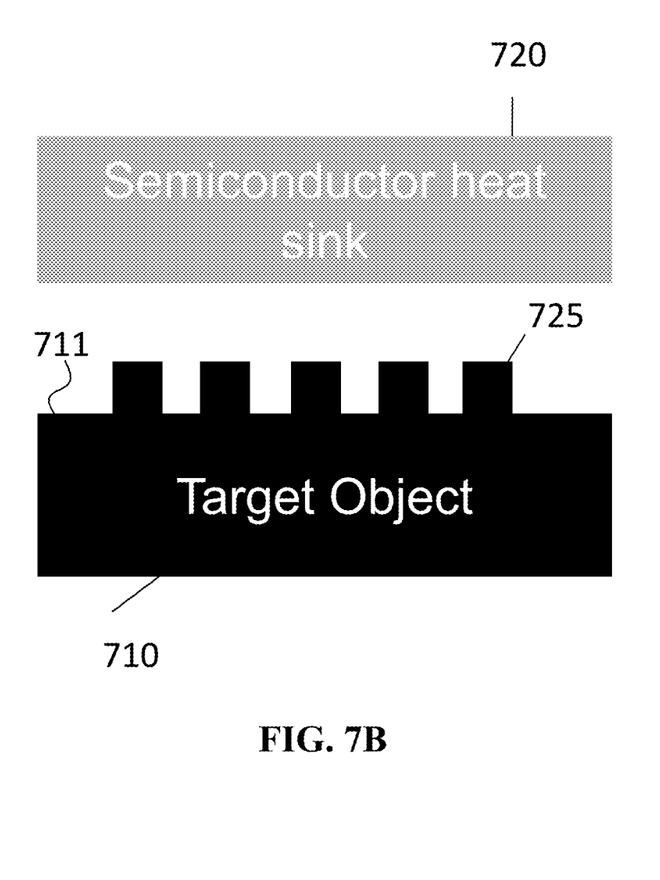

FIGS. 7A and 7B show examples of the target object having surface pattered with periodic nano-scale structures according to some embodiments. Such nano-scale structures, such as spheres 715 or cubes 725, introduced to the surface 711 of the target object 710 closest to the heat sink can help to better match the resonant frequency of the target object to the bandgap of the semiconductor heat sink. In some implementations, the separations between spheres or cubes are between 400 nm to 1000 nm, and the linear dimension of spheres or cubes are between 200 nm to 900 nm.

Figure 8:
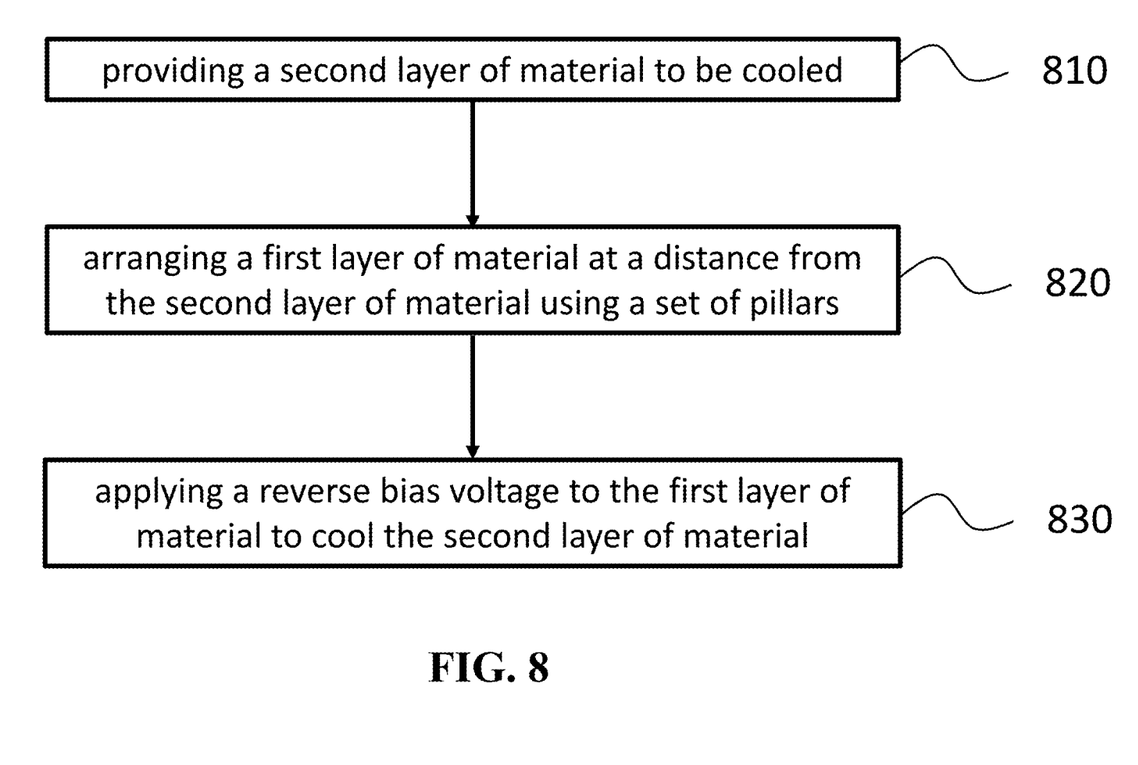
FIG. 8 shows a block diagram of a method for fabricating a negative electroluminescent cooling device according to some embodiments.

FIG. 8 shows a block diagram of a method for fabricating a negative electroluminescent cooling device according to some embodiments. The method includes providing 810 a second layer of material and arranging 820 a first layer of material at a distance from the second layer of material using a set of pillars allowing passage of photons from the second layer of material to the first layer of material. The material of the first layer and the material of the second layer are selected such that the material of the first layer is a semiconductor material with a bandgap less or equal to energy of a resonant frequency of the second layer of material or the material of the first layer is the same as the material of the second layer. Next, the method includes applying 830 a reverse bias voltage to the first layer of material to cool the second layer of material.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:

1. A negative electroluminescent cooling device, comprising:
   a first layer of material;
   a second layer of material arranged at a non-zero distance from the first layer of material, wherein the first layer of material includes a semiconductor with a bandgap less than or equal to a surface resonant energy of the second layer of material;
   a set of supporters to connect and support the first layer of material and the second layer of material while allowing passage of photons from the second layer of material to the first layer of material, wherein the set of supporters is a set of pillars of oxides or semiconductor materials, such that a combined cross-section area of a cross-section area of each pillar from for the set of pillars is more than 100000 times smaller than an area of the cross-section of the first layer of material or the second layer of material, and
   wherein the surface resonant energy of the second layer of material corresponds to a resonant frequency of the second layer of material, wherein the resonant frequency of the second layer of material is in a range between 10 to 1000 nanometers (nm), and wherein the distance between the first layer of material and the second layer of material is smaller than a wavelength of the resonant frequency of the second layer of material; and
   an energy source to apply a reverse bias voltage to the first layer of material to cool the second layer of material.

2. The device of claim 1, wherein the second layer of material includes a metal or a doped semiconductor.

3. The device of claim 2, wherein a surface of the second layer of material closest to the first layer of material is patterned with nano-scale structures.

4. The device of claim 3, wherein the pattern of the nano-scale structures is selected to match the surface resonant energy of the second layer of material to the bandgap of the semiconductor of the first layer of material.

5. The device of claim 3, wherein the pattern of the nano-scale structures and a mutual arrangement of the first layer of material and the second layer of material establish a surface plasmon resonance between the first layer of material and the second layer of material.

6. The device of claim 1, wherein the second layer of material includes plasmonic material.

7. The device of claim 6, wherein the plasmonic material is zirconium carbide (ZrC).

8. The device of claim 1, wherein the first layer of material includes a p-doped region, an n-doped region, and an undoped region extending between the p-doped region and the n-doped region, and a reverse bias voltage across the p-doped and n-doped regions that drives electrons out of the semiconductor of the first layer of material.

9. The device of claim 1, wherein an amplitude of the reverse bias voltage, multiplied by an electron charge, is between two and three times an energy of the bandgap.

10. The device of claim 1, wherein a ratio of an energy of the bandgap to the resonant surface energy is between 1 and 1.2.

11. The device of claim 1, wherein the thickness of the first layer of material is between 1 and 3 μm.

12. The device of claim 1, wherein the first layer of material serves as a heat sink to cool the second layer of material.

13. The device of claim 1, wherein the second layer of material forms at least part of one or combination of a processor, a light-emitting-diode, a transistor, and a power amplifier.

14. A method for manufacturing a negative electroluminescent cooling device, comprising:
   providing a first layer and a second layer of material;
   arranging the second layer of material at a non-zero distance from a first layer of material, wherein the first layer of material includes a semiconductor with a bandgap less than or equal to a surface resonant energy of the second layer of material;
   connecting a set of supporters to support the first layer of material and the second layer of material while allowing passage of photons from the second layer of material to the first layer of material, wherein the set of supporters is a set of pillars of oxides or semiconductor materials, such that a combined cross-section area of a cross-section area of each pillar for the set of pillars is more than 100000 times smaller than an area of the cross-section of the first layer of material or the second layer of material, and
   wherein the surface resonant energy of the second layer of material corresponds to a resonant frequency of the second layer of material, wherein the resonant frequency of the second layer of material is in a range between 10 to 1000 nanometers (nm), and wherein the distance between the first layer of material and the second layer of material is smaller than a wavelength of the resonant frequency of the second layer of material; and
   applying a reverse bias voltage using an energy source to the first layer of material to cool the second layer of material.

15. The method of claim 14, further comprising: patterning a surface of the second layer of material closest to the first layer of material with nano-scale structures, wherein the second layer of material includes a metal or a doped semiconductor, such that the pattern of the nano-scale structures is selected to match the surface resonant energy of the second layer of material to the bandgap of the semiconductor of the first layer of material.

16. The method of claim 14, wherein the first layer of material includes a p-doped region, an n-doped region, and an undoped region extending between the p-doped region and the n-doped region, and a reverse bias voltage across the p-doped and n-doped regions that drives electrons out of the semiconductor of the first layer of material.

* * * * *